United States Patent
Kamimura et al.

(10) Patent No.: US 9,012,925 B2
(45) Date of Patent: Apr. 21, 2015

(54) SOLID STATE IMAGING DEVICE HAVING A PAIR OF CHARGE HOLDING FILMS

(71) Applicant: Kabushiki Kaisha Toshiba, Tokyo (JP)

(72) Inventors: Masaki Kamimura, Oita (JP); Shinji Uya, Oita (JP); Tomoyasu Kudo, Nagasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 150 days.

(21) Appl. No.: 13/787,746

(22) Filed: Mar. 6, 2013

(65) Prior Publication Data

US 2013/0264670 A1    Oct. 10, 2013

(30) Foreign Application Priority Data

Apr. 9, 2012   (JP) .................................. 2012-088587

(51) Int. Cl.
| | |
|---|---|
| *H01L 27/15* | (2006.01) |
| *H01L 21/00* | (2006.01) |
| *H01L 31/02* | (2006.01) |
| *H01L 31/18* | (2006.01) |
| *H01L 31/0216* | (2014.01) |
| *H01L 27/146* | (2006.01) |

(52) U.S. Cl.
CPC ................ *H01L 31/02* (2013.01); *H01L 31/18* (2013.01); *H01L 27/14627* (2013.01); *H01L 31/0216* (2013.01); *H01L 27/1464* (2013.01); *H01L 27/14643* (2013.01)

(58) Field of Classification Search
CPC ................... H01L 31/0216; H01L 21/14643; H01L 27/14627; H01L 27/1464; H01L 31/18
See application file for complete search history.

(56) References Cited

U.S. PATENT DOCUMENTS

| | | | |
|---|---|---|---|
| 2008/0035965 A1 | 2/2008 | Hayashi et al. | |
| 2009/0090988 A1 | 4/2009 | Ohgishi | |
| 2009/0096049 A1 | 4/2009 | Oshiyama et al. | |
| 2009/0209056 A1 | 8/2009 | Hiyama et al. | |
| 2012/0025179 A1* | 2/2012 | Mitsui et al. | 257/40 |
| 2013/0069047 A1* | 3/2013 | Mitsui et al. | 257/40 |

FOREIGN PATENT DOCUMENTS

| | | |
|---|---|---|
| JP | 2006-344649 | 12/2006 |
| JP | 2008-306154 | 12/2008 |
| JP | 2009-218438 | 9/2009 |

* cited by examiner

*Primary Examiner* — Alonzo Chambliss
(74) *Attorney, Agent, or Firm* — Patterson & Sheridan, LLP

(57) ABSTRACT

A solid-state imaging device according to embodiments of the present disclosure includes a light receiving unit, a first charge holding film, and a second charge holding film. The light receiving unit converts the incident light to an electric current. The first charge holding film is formed above the light receiving unit and holds electric charges. The second charge holding film is formed on the first charge holding film and holds electric charges. Further, concentration of oxygen in the second charge holding film is higher than concentration of oxygen in the first charge holding film.

20 Claims, 5 Drawing Sheets

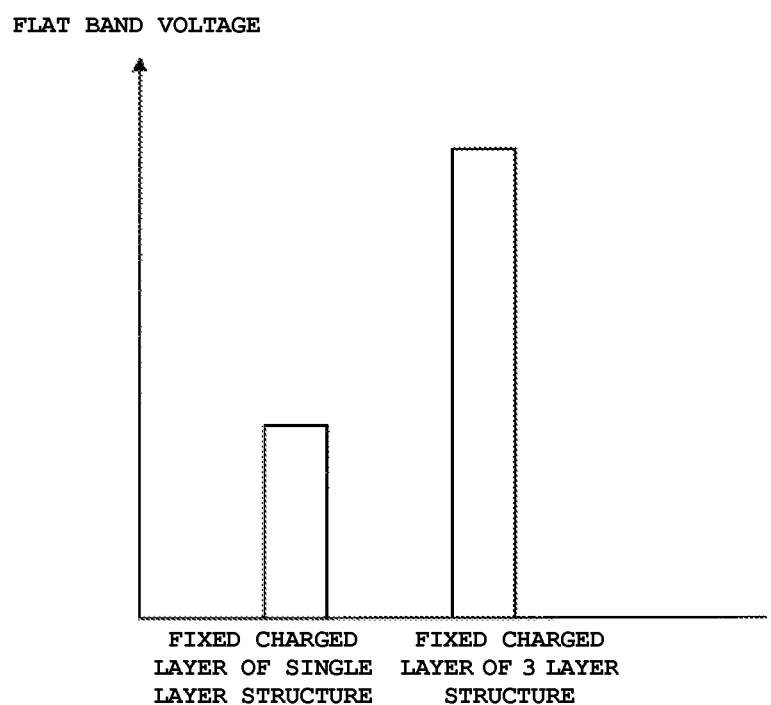

Fig. 6A

|   |   | HfOx | AlOx |
|---|---|---|---|
| C | [atoms/cm^3] | 3.0E+20 | 2.0E+20 |
| N | [atoms/cm^3] | 1.5E+20 | 3.0E+18 |
| H | [atoms/cm^3] | 4.0E+20 | 5.0E+19 |

Fig. 6B

|   |   | SiO2 (IN THE FILM) | SiO2 (INTERFACE) |
|---|---|---|---|
| C | [atoms/cm^3] | 1.8E+18 | 3.0E+19 |
| N | [atoms/cm^3] | 4.0E+18 | 1.0E+20 |
| H | [atoms/cm^3] | 4.0E+21 | 4.0E+21 |

US 9,012,925 B2

SOLID STATE IMAGING DEVICE HAVING A PAIR OF CHARGE HOLDING FILMS

CROSS-REFERENCE TO RELATED APPLICATION

This application is based upon and claims the benefit of priority from Japanese Patent Application No. 2012-088587, filed Apr., 2012; the entire contents of which are incorporated herein by reference.

FIELD

Embodiments described herein relate to a solid-state imaging device and a manufacturing method of the solid-state imaging device.

BACKGROUND

Previously, in the solid-state imaging device, electric charge present in a light receiving unit has been detected as electric current (hereafter, described as "dark current"), whether or not light is incident on the light receiving unit which carries out a photoelectric conversion of the incident light. As a result, the conventional solid-state imaging device has a problem that it perceives that an image brighter than the actual one is present.

To solve this problem, it has been proposed to form a fixed charge layer above the light receiving unit. For example, if negative electric charge is generated due to photoelectric conversion, the fixed charge layer is configured to attain the negative electric charges. In such a solid-state imaging device, the positive electric charges in the light receiving unit are accumulated at the upper surface of the light receiving unit, because the negative electric charge in the fixed charge layer attracts the positive electric charge. The accumulation results in recombination of the negative electric charge present in the light receiving unit with the positive electric charge accumulated at the upper surface of the light receiving unit, regardless of the presence of incident light. Thus, it is not likely that the negative electric charge present in the light receiving unit is detected as the dark current. Therefore, by having the fixed charge layer, the solid-state imaging device can control or prevent the generation of dark current.

To the contrary, if the electric charges generated by the photoelectric conversion are positive, a fixed charge layer having a positive electric charge is formed above the light receiving unit. By the fixed charge layer, generation of dark current can be similarly controlled or eliminated.

However, to control the generation of dark current more reliably, it is necessary to further increase the amount of electric charges held in the fixed charge layer.

DESCRIPTION OF THE DRAWINGS

FIG. 5 is an explanatory figure showing the flat band voltage of the fixed charge layer according to the second embodiment.

FIG. 6A is an explanatory figure showing the content of impurities in a first charge holding film and a third charge holding film according to the second embodiment.

FIG. 6B is an explanatory figure showing the content of impurities in a second charge holding film according to the second embodiment.

DETAILED DESCRIPTION

In general, according to one or more embodiments of the present invention, a solid-state imaging device and a manufacturing method of the solid-state imaging device pertaining to the embodiments will be explained below in detail by referring to the accompanying drawings. Furthermore, this disclosure is not limited to the embodiments described below.

The embodiments of the present invention are directed to provide a solid-state imaging device and a manufacturing method of the solid-state imaging device in which the amount of electric charges in the fixed charge layer is larger than in a conventional device.

According to the embodiments of the present invention, the solid-state imaging device comprises a light receiving unit, a first charge holding film, and a second charge holding film. The light receiving unit performs a photoelectric conversion of an incident light. The first charge holding film is formed above the light receiving unit. The second charge holding film is formed on the first charge holding film. Further, concentration of oxygen in the second charge holding film is higher than concentration of oxygen in the first holding film.

First Embodiment

In this embodiment, the so called backside-illumination-type CMOS (Complementary Metal Oxide Semiconductor) image sensor will be explained as an example of the solid-state imaging device. The backside-illumination-type CMOS has a light receiving unit that performs photoelectric conversion of the incident light that is incident on one side and has a wiring layer that is formed on the opposite side from which the incident light is received.

Moreover, the case in which the backside-illumination-type CMOS image sensor performs photoelectric conversion of the incident light to negative electric charges will be explained below. However, the backside-illumination-type CMOS image sensor according to the embodiment may have a structure wherein the incident light is photo-electrically converted to positive electric charges.

Furthermore, the solid-state imaging device according to the embodiment is not limited to the backside-illumination-type CMOS image sensor. It may be one of various types of image sensors including a backside-illumination-type CMOS image sensor or a CCD (Charge Couple Device) image sensor.

Figure 1:
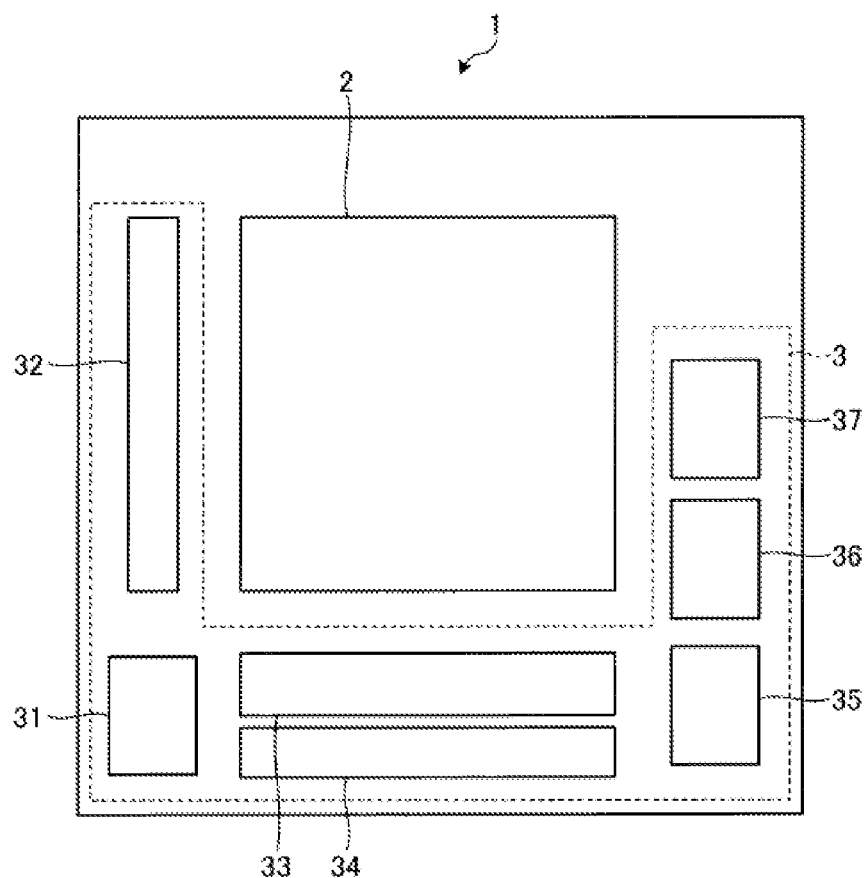
FIG. 1 illustrates a planar view of an example of a CMOS sensor according to the first embodiment.

FIG. 1 is an explanatory drawing that shows in plan view a backside-illumination-type CMOS image sensor according to the first embodiment (hereafter described as "CMOS sensor 1"). As shown in FIG. 1, the CMOS sensor 1 is provided with a pixel unit 2 and a logic unit 3 formed on a semiconductor substrate.

The pixel unit 2 has several pixels provided in a matrix shape, each of which corresponds to a different picture element of the image to be captured. Moreover, each pixel has a light receiving unit that accumulates negative electric charges obtained by photoelectrically converting the incident light and multiple transistors such as a transistor for controlling whether to release the negative electric charges accumulated in the light receiving unit as an electric current and a transistor for amplifying the electric current.

The logic unit 3 has a timing generator 31, a vertical select circuit 32, a sampling circuit 33, a horizontal select circuit 34, a gain control circuit 35, an A/D (Analog/Digital) conversion circuit 36, and an output circuit 37, etc.

The timing generator 31 is a processing unit that outputs a pulse signal, which is the basis of operation timing of each transistor, to the transistors provided in the pixel unit 2 and the logic unit 3. The vertical select circuit 32 is a processing unit that sequentially selects the pixels by columns. The selected pixels are the pixels from which the accumulated negative electric charges corresponding to the strength of the incident light are released. The horizontal select circuit 34 is a processing unit that sequentially selects the pixel by rows. Similarly, the selected pixels are pixels from which the accumulated negative electric charges are released. A selected pixel is selected when a horizontal selection of a line and the vertical selection of a row intersect at a specific pixel.

The sampling circuit 33 is a processing unit for driving the transistor of the pixel selected by the vertical select circuit 32 and horizontal select circuit 34 to release the negative electric charges from the light receiving unit at a timing synchronized with the pulse signals output by the timing generator 31. Such sampling circuit 33 outputs the signal corresponding to the amount of the released negative electric charges to the gain control circuit 35.

The gain control circuit 35 is a processing unit for adjusting the gain of the signals input from the sampling circuit 33 and outputting it to the A/D conversion circuit 36. The A/D conversion circuit 36 is a processing unit for converting the analog signal input from the gain control circuit 35 to a digital signal and outputting it to the output circuit 37. The output circuit 37 is a processing unit for outputting the digital signal input from the A/D conversion circuit 36 (and amplifying it if needed) to a specific DSP (Digital Signal Processor (omitted in the drawings)).

Figure 2:
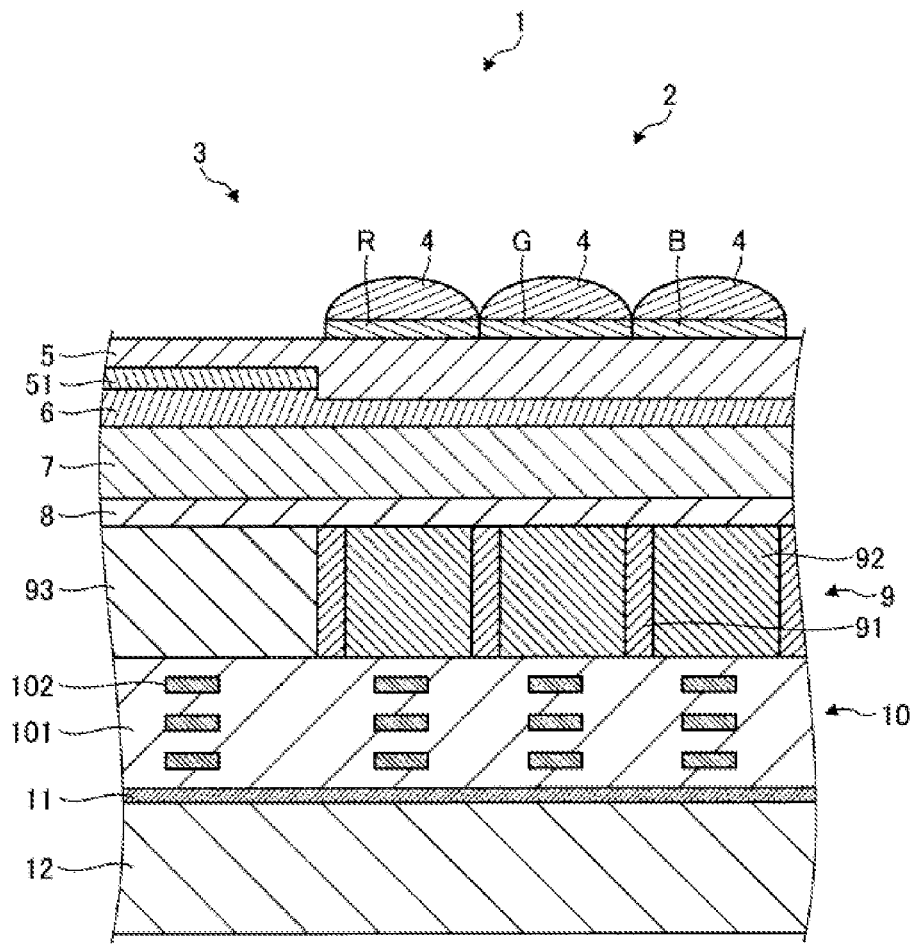
FIG. 2 illustrates a cross-sectional view of the CMOS sensor according to the first embodiment.

Next, the cross-sectional configuration of the CMOS sensor 1 will be explained by referring to FIG. 2. FIG. 2 is an explanatory drawing of a cross-sectional view of a CMOS sensor 1 according to the first embodiment.

As shown in FIG. 2, the CMOS sensor 1 has microlenses 4, color filters R, G, and B, a protective layer 5, an antireflection layer 6, a fixed charge layer 7, a P-type semiconductor layer 8, an N-type semiconductor layer 9, a wiring layer 10, an adhesion layer 11, and a supporting substrate 12, sequentially positioned on a substrate from the side on which the light is incident thereon.

Furthermore, the CMOS sensor 1 has a light-shielding film 51 between a portion of the protective layer 5 and the antireflection layer 6 in the logic unit 3. A thin oxide film for reducing the interface state is provided in between the P-type semiconductor layer 8 and the fixed charge layer 7; however, this film will not be omitted in the drawing.

The microlens 4 is a condenser lens that condenses the incident light incident on the CMOS sensor 1. Furthermore, the color filter R is a filter that selectively transmits red light. The color filter G is a filter that selectively transmits green light. The color filter B is a filter that selectively transmits blue light. Thus, photoelectric conversion of the lights that these color filters R, G, and B transmit is done separately in the CMOS sensor 1 by color, generating signals corresponding to one pixel.

The protective layer 5 is a layer that protects the upper surface of the CMOS sensor 1. For instance, the protective layer 5 is made of a silicon nitride film. The light-shielding film 51 is a film that prevents the incident light on the logic unit 3 from going to the pixel unit 2. For instance, the light-shielding film 51 is a metal film comprised of aluminum or titanium.

The antireflection layer 6 is a layer that prevents the incident light on the CMOS sensor 1 from reflecting therefrom. The antireflection layer 6 is comprised of a material having a photorefractive index that is below a predetermined value.

The fixed charge layer 7 holds a certain electric charges (here, negative electric charges) and controls the dark current caused by the negative charges held in the inner part of the N-type semiconductor layer 9 regardless of whether the light is incident on the CMOS sensor 1. In this embodiment, the fixed charge layer 7 has a multilayered structure. Due to the structure, the amount of the negative electric charges held in the fixed charge layer 7 is larger compared to a case in which the fixed charge layer 7 has a single-layered structure. The description of why generation of dark current is effectively controlled by the multilayered structure will be given later by referring to FIG. 3A and FIG. 3B.

The P-type semiconductor layer 8 is a semiconductor layer in which P-type impurities such as boron are added. The P-type semiconductor layer 8 has a P+ layer (not shown in the drawing) in which comparatively higher concentration of P-type impurities are added in the upper layer, and a P layer (also not shown in the drawing) in which comparatively lower concentration of P-type impurities are added in the lower layer.

The N-type semiconductor layer 9 is a semiconductor layer in which N-type impurities such as phosphorus are added. The N-type semiconductor layer 9 has an element isolation area 91 in which P-type impurities are added. In the pixel unit 2, the N-type semiconductor layer 9 is isolated by the element isolation area 91 and constitutes a plurality of portions, each of which underly a lens 4. Each portion of the N-type semiconductor layer 9 individually functions as a light receiving unit 92 that receives the incident light through the lenses. Moreover, in the CMOS sensor 1, a photodiode is formed by PN junction of the N-type semiconductor layer 9 and the P-type semiconductor layer 8 in each light receiving unit 92.

Furthermore, in the logic unit 3, the N-type semiconductor layer 9 is electrically isolated from the N-type semiconductor layer 9 located in the pixel unit 2 by the element isolation area 91 and constitutes a peripheral circuit region 93. Circuit elements such as transistors are formed in such peripheral circuit region 93.

A wiring layer 10 has an interlayer insulating film 101 and multilayered wirings 102 that are formed in the interlayer insulating film 101. The interlayer insulating film 101 is formed, for example, by silicon oxide, etc. The multilayered wirings 102 are used in transmitting the photoelectrically converted negative electric charges or driving signal to the circuit elements.

An adhesion layer 11 is a layer comprised of adhesive material and adheres to the wiring layer 10 and the supporting substrate 12. The supporting substrate 12 supports the stacked layers of the P-type semiconductor layer 8, the N-type semiconductor layer 9, and the wiring layer 10, when the upper surface of the P-type semiconductor layer 8 is exposed by a polishing process The detail of the process will be explained below.

Here, the manufacturing process of the CMOS sensor 1 will be explained. In manufacturing such CMOS sensor 1, first, the P-type semiconductor layer 8 and the N-type semiconductor layer 9 are formed on a substrate (not shown in the drawing) using an epitaxial method or an ion implantation method, in the above-mentioned order.

Next, the element isolation area 91 is formed by adding the P-type impurity to predetermined portions of the N-type semiconductor layer 9 by an ion implantation method. The portions of the N-type semiconductor layer 9 partitioned by the element isolation area 91 constitute the peripheral circuit region 93 and several light receiving units 92. After that, various circuit elements (not shown in the drawing) such as a transistor group, etc. are formed at a predetermined position of the peripheral circuit region 93 and the light receiving unit 92.

Then, after forming the wiring layer 10 on the N-type semiconductor layer 9, the wiring layer 10 and the supporting substrate 12 are bonded together by using an adhesion layer 11. Then, the surface of the P-type semiconductor layer 8 is exposed by polishing the layer on which the P-type semiconductor layer is formed.

After that, an oxide film (not shown in the drawing) and a fixed charge layer 7 are formed on the exposed surface of the P-type semiconductor layer 8, in the above-mentioned order. In the process forming the fixed charge layer 7, the fixed charge layer 7 having a multilayered structure is formed. A forming method of the fixed charge layer 7 having the multilayered structure will be explained later by referring to FIG. 3B.

Next, the antireflection layer 6, the light-shielding film 51, the protective layer 5, the color filters R, G, and B, and the microlens 4 are formed on the fixed charge layer 7. Through those processes, the CMOS sensor is manufactured.

The CMOS sensor 1 photoelectrically converts the light incident onto the light receiving unit 92 via the microlens 4 from outside to negative electric charges and accumulates them in the light receiving unit 92. Thus, the negative electric charges corresponding to the strength of the incident light are accumulated in the light receiving unit 92. The CMOS sensor 1 records an image by generating signals corresponding to the amount of the negative electric charges released from each light receiving unit 92.

At this time, regardless of the presence of the incident light, negative electric charges may exist in the light receiving unit 92. In such a case, more lighter and blurry images are taken by the CMOS sensor 1, because the generated signals correspond to the sum of the negative electric charges held in the light receiving unit 92 regardless of the incident light and the negative electric charges caused by the incident light.

To solve this problem, the fixed charge layer 7 that holds electric charges is provided in the CMOS sensor 1 on the light-incident side of the light receiving unit 92. In addition, the fixed charge layer 7 has a multilayered structure. Due to the fixed charge layer 7 generation of dark current is more effectively controlled. The CMOS sensor 1 with the fixed charge layer 7 will be more specifically explained below by referring to FIG. 3A and FIG. 3B.

First, a fixed charge layer having a single layer structure will be explained by referring to FIG. 3A to clarify the functional effect of the fixed charge layer according to the first embodiment. Then, the fixed charge layer 7 according to the first embodiment will be explained by referring to FIG. 3B.

Figure 3A:
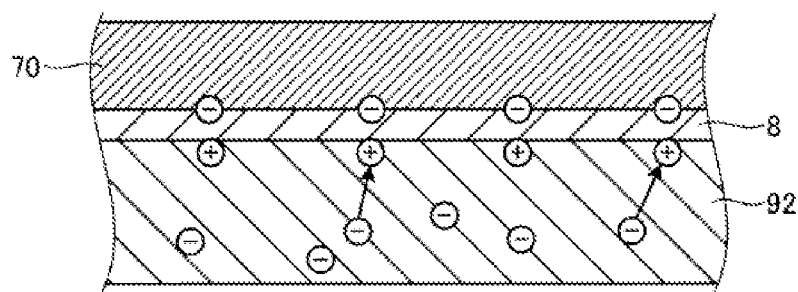
FIG. 3A illustrates a cross-sectional view of a fixed charge layer when the fixed charge layer has a single layer structure.
Figure 3B:
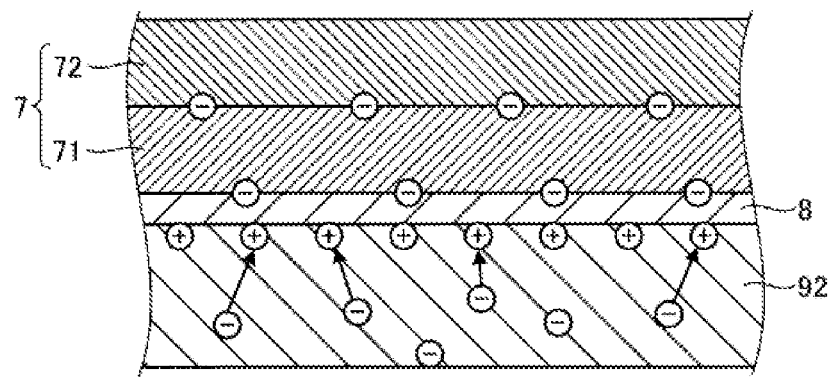
FIG. 3B illustrates a cross-sectional view of a fixed charge layer according to the first embodiment.

FIG. 3A is an explanatory drawing of the cross-sectional view when a fixed charge layer 70 having a single layer structure, instead of the fixed charge layer 7 in the first embodiment, is provided. FIG. 3B is a cross-sectional view of the fixed charge layer 7 according to the first embodiment. Both FIG. 3A and 3B selectively show the interlayer portion sandwiched by the wiring layer 10 and the anti reflection layer 6 as shown in FIG. 2.

As shown in FIG. 3A, when the fixed charge layer 70 having a single layer structure is provided at the light-incident side of the light receiving unit 92, negative electric charges are accumulated at the interface (to be exact, the interface of the oxide membrane that lowers an interface state and the fixed charge layer 70) of the fixed charge layer 70 and the P-type semiconductor 8.

If a positive bias is applied to the light receiving unit 92 so that the PN junction portion between the P-type semiconductor layer 8 and the light receiving unit 92 can function as a photodiode, polarization occurs inside the fixed charge layer 70. Thus, the negative electric charges are further accumulated at the interface between the fixed charge layer 70 and the P-type semiconductor layer 8.

In the light receiving unit 92, the negative electric charges held at the interface of the fixed charge layer 70 attract the positive electric charges that exist in the light receiving unit 92. The attracted positive electric charges accumulate at the interface of the light receiving unit 92 with the P-type semiconductor layer 8. Then, the attracted positive electric charges reconnect with the negative electric charges held in the light receiving unit 9, at least a part of which are held regardless of the incident light. Thus, the effect of the dark current is reduced.

However, in order to reduce the effect of the dark current more efficiently, a larger amount of the negative electric charges held in the light receiving unit 92 regardless of the incident light need to reconnect with the positive electric charges attracted at the interface of the light receiving unit 92. In order to encourage the reconnection, a larger amount of the positive electric charge need to be attracted at the interface of the light receiving unit 92 with the P-type semiconductor layer 8.

To achieve this result, in this embodiment, the amount of positive electric charges that accumulate at the interface of the light receiving unit 92 and P-type semiconductor layer 8 is increased by making the fixed charged layer 7 a multi layer structure. Specifically, as shown in FIG. 3B, the fixed charge layer 7 has a first charge holding film 71 that holds the electric charges and is formed at the light-incident side of the light receiving unit 92. Further, the fixed charge layer 7 has a second charge holding film 72 that has higher concentration of oxygen compared to the first charge holding film 71. The fixed charge layer 7 holds electric charges and is formed on the first charge holding film 71 and at the light-incident side of the first charge holding film 71.

In the fixed charge layer 7, the negative electric charges accumulate at the interface of the first charge holding film 71 and P-type semiconductor layer 8 (to be exact, the interface with the oxide film that lowers the interface state and the first charge holding film 71) and at the interface of the first charge holding film 71 and the second charge holding film 72.

Furthermore, since the second charge holding film 72 has higher concentration of oxygen than the first charge holding film 71 has, oxygen atoms with dangling bonds are disposed at the interface of the second charge holding film 72 with the first charge holding film 71. Thus, the second charge holding film 72 can efficiently hold the negative electric charges due to the dangling bonds in the interface with the first charge holding film 71. Therefore, a larger amount of the negative electric charges can accumulate compared to the case in which the fixed charge layer is simply made of a single layer.

In other words, because the fixed charge layer 7 can hold a larger amount of the negative electric charges than the fixed charge layer 70 having a single layer structure (refer to FIG. 3A) does, a larger amount of the positive electric charges can accumulate at the interface between the P-type semiconductor layer 8 and the light receiving unit 92. Therefore, the CMOS sensor 1 according to the first embodiment can control the generation of dark current more reliably than a CMOS sensor with the fixed charge layer 70 having a single-layer structure.

The fixed charge layer 7 is formed by the following manufacturing method. First, the first charge holding film 71 is formed on the surface of an oxide film (not shown in the drawing) at the light-incident side of the P-type semiconductor layer 8. The oxide film reduces the interface state at the surface and this film is formed by the previously mentioned process. After that, the second charge holding film 72 is formed on the first charge holding film 71 and at the light-incident side of the first charge holding film 71.

In this process, using the ALD (Atomic Layer Deposition), the predetermined metal oxide films are formed, which constitute the first charge holding film 71 and the charge holding film 72. The first charge holding film 71 and the charge holding film 72 are formed in this order.

The first charge holding film 71 and the second charge holding film 72 include, for example, any of hafnium oxide, aluminum oxide, zirconium oxide, titanium oxide, tantalum oxide, and ruthenium oxide, or the combinations thereof.

If the first charge holding film 71 and the second charge holding film 72 contain the same metal element, the first charge holding film 71 and the second charge holding film 72 can be easily formed by simply changing the amount of oxygen contained in each metal oxide film.

The first charge holding film 71 and the second charge holding film 72 may be a metal oxide film containing various metal elements each of which has a different crystal structure. By laminating the metal oxide films having different crystal structures, more elements that have dangling bonds can exist at the interface between the oxide films. Thus, more negative electric charges can be held at the interface of the second charge holding film 72 with the first charge holding film 71.

Also, the first charge holding film 71 and the second charge holding film 72 are formed at a temperature less than an upper limit temperature (for example, 100° C. or less), which is determined by a heat resistance limit temperature of the already formed constituent elements in the CMOS sensor 1. In this range of temperature, the already formed constituent elements can be prevented from being adversely affected by the heat at the time of carrying out ALD.

Also, to enhance the concentration of oxygen in the second charge holding film 72 than the first charge holding film 71, steam oxidation of the second charge holding film 72 can be used. However, the method to enhance the concentration of oxygen content is not restricted to steam oxidation.

For example, the concentration of oxygen in the second charge holding film 72 can be increased compared to that in the first charge holding film 71 by performing a predetermined heat process such as annealing, etc., after carrying out an ion implantation of oxygen ions to the second charge holding film 72.

In addition, also while performing any of the processes such as an ion implantation and a heat treatment or stream oxidization, the process of increasing the concentration of oxygen is preferably performed at a temperature less than the heat resistance upper limit temperature of the already formed constituent elements in the CMOS sensor 1.

Further, in the process of forming the second charge holding film 72, the concentration of oxygen in the second charge holding film 72 is preferably few % (for example, 3%) higher than that in the first charge holding film 71. Also, at the time of forming the second charge holding film 72, the material which concentration of oxygen atoms is above 10% or more at 1 cm ^ 3 (for example, source gas) is used.

Second Embodiment

The CMOS sensor in the second embodiment will be explained. The difference between the CMOS sensor in this embodiment and the CMOS sensor 1 in the first embodiment is in the configuration of the fixed charge layer. For this reason, a fixed charge layer 7a in this embodiment will be explained with reference to FIG. 4, and the explanation of the other elements in the CMOS sensor will be omitted.

Figure 4:
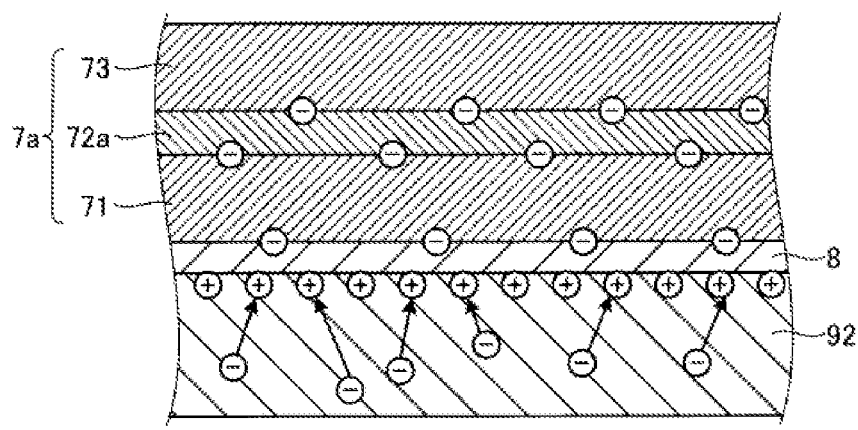
FIG. 4 illustrates a cross-sectional view of the fixed charge layer according to the second embodiment.

FIG. 4 is the explanatory drawing of the cross-sectional view of the fixed charge layer 7a according to the second embodiment. In the following explanations, the same numbers will be given to the elements shown in FIG. 4 that constitute the same elements shown in the FIG. 3B, and the explanation thereof will be omitted.

As shown in FIG. 4, the fixed charge layer 7a has a second charge holding film 72a for holding negative electric charges at the light-incident side of the first charge holding film 71. In addition, a third charge holding film 73 for holding negative electric charges is provided at the light-incident side of the second charge holding film 72a.

Here, the second charge holding film 72a is a thin film that is formed by silicon oxide as the material. The third charge holding film 73 is a metallic oxide film formed by a material that contains metallic elements that are the same with or different from that of the first charge holding film 71. Thus, the fixed charge layer 7a has a trilaminar structure that is comprised of the first charge holding film 71, the second charge holding film 72a, and the third charge holding film 73.

Due to the trilaminar structure, the fixed charge layer 7a can hold the negative electric charges at the interface between the second charge holding film 72a and the third charge holding film 73 in addition to at the holding area of the negative electric charges in the fixed charge layer 7 described in the first embodiment. Therefore, as the fixed charge layer 7a can hold a larger amount of the negative charges, the generation of dark current can be controlled more certainly.

Moreover, in FIG. 4, for convenience, the film thickness of the second charge holding film 72a will be shown thicker than the actual thickness compared to the other layers. However, the film thickness of the second charge holding film 72a is formed more than 1 order of magnitude thinner (i.e., at least ten times thinner) than the film thickness of the first charge holding film 71.

Thus, in the fixed charge layer 7a, by making the second charge holding film 72a thin, the distance from the negative electric charges that are retained in the interface between the second charge holding film 72a and the third charge holding film 73 to the light receiving unit 92 is shortened For instance, if the film thickness of the first charge holding film 71 is in the range of 60-100 nm, the film thickness of the second charge holding film 72a is set to 2 nm or less.

By setting the film thickness of the second charge holding film 72a appropriately, the positive electric charges that exist in the light receiving unit 92 can be more effectively attracted to the interface between the light receiving unit 92 and the P-type semiconductor layer 8 by the negative electric charges retained in the interface between the second charge holding film 72a and the third charge holding film 73.

Therefore, according to the fixed charge layer 7a, since the amount of the positive electric charges attracted to the interface between the light receiving unit 92 and the P-type semiconductor layer 8 can be further increased, the generation of dark current can be controlled further more effectively.

Next, the measurement result of the flat band voltage of the fixed charge layer 7a according to the second embodiment will be explained by referring to FIG. 5. FIG. 5 is an explanatory drawing showing the flat band voltage of the fixed charge layer 7a according to the second embodiment and the flat band voltage of a fixed charge layer 70, which has a single layer structure.

As shown in FIG. 5, as a result of measurement of the flat band voltage of the fixed charge layer 70 (FIG. 3A) of a single-layer structure and the flat band voltage of the fixed charge layer 7a of a trilaminar structure, the flat band voltage in the fixed charge layer 7a attains about two times larger value than that in the fixed charge layer 70.

The result of this measurement shows that the fixed charge layer 7a retains about two times more negative electric charges than the fixed charge layer 70. This measurement result supports that the CMOS sensor according to the embodiment can more reliably control the generation of dark current than the CMOS sensor with the fixed charge layer 70 having a single-layer structure.

Next, the contents of impurities in the fixed charge layer mentioned in the second preferred embodiment will be explained by referring to FIG. 6A and FIG. 6B. FIG. 6A is an explanatory table showing the contents of impurities in the first charge holding film 71 and the third charge holding film 73 according to the second embodiment. FIG. 6B is an explanatory table showing the contents of impurities in the second charge holding film 72a according to the second embodiment.

If the first charge holding film 71 and the third charge holding film 73 is made of hafnium oxide (HfOx) or aluminum oxide (AlOx), the values shown in FIG. 6A indicate the upper limits of the contents of carbon (C) and nitrogen (N) in the first charge holding film 71 and the third charge holding film 73. By determining the content of impurities in the first charge holding film 71 and the third charge holding film 73 in the ranges, the amount of the negative electric charges held in the fixed charge layer 7a can be suitably set.

It is preferable that the amount of hydrogen (H) as the impurity shown in FIG. 6A is included in the first charge holding film 71 and the third charge holding film 73 to optimize the termination of interfaces of the first charge holding film 71 and interfaces of the third charge holding film 73.

Moreover, if the second charge holding film 72a is made of silicon dioxide (SiO$_2$), the values shown in FIG. 6B indicate the upper limits of the contents of carbon (C) and nitrogen (N) in and the interface of the second charge holding film 72a. By determining the content of impurities in the second charge holding film 72a in the ranges, the amount of the negative electric charges held in the fixed charge layer 7a can be suitably set.

It is preferable that the amount of hydrogen (H) as the impurity shown in FIG. 6B is included in the second charge holding film 72a to optimize the termination of interfaces of the second charge holding film 72a.

If the second charge holding film 72a is made of silicon dioxide, it is preferable that the second charge holding film 72a contains silicon in the amount of $1\times10^{20}$ atoms/cm$^3$ or more. Due to the silicon, while the silicon is oxidized to form the second charge holding film 72a, a sufficient amount of oxygen required to form the second charge holding film 72a is captured. Thus, it is possible to configure the CMOS sensor so that the second charge holding film 72 includes a higher amount of oxygen than the first charge holding film 71.

In the above described embodiments, the cases wherein the fixed charge layer has 2 or 3 layers of the charge holding film have been explained. However, the fixed charge layer in this embodiment may have the structure having 4 or more layers of charge holding films.

Moreover, in the above described embodiments, the CMOS sensor in which the incident light is photoelectrically converted to negative electric charges is explained as an example. However, the CMOS sensor of this embodiment may be configured to photoelectrically convert the incident light to positive electric charges.

If the CMOS sensor is configured to photoelectrically convert the incident light to positive electric charges, conductivity types (P-type, N-type) of each constituent element in the CMOS sensor 1 shown in FIG. 2 are reversed. In this case, each charge holding film is composed to hold positive electric charges at the interfaces.

For example, the first through third charge holding layers are composed of metallic oxide films containing carbon. Further, the amount of carbon in the second charge holding film is set to be larger than the amount of carbon in the first charge holding film. Also, the amount of carbon in the second charge holding film is set to $1\times10^{20}$ atoms/cm$^3$ or more. By configuring the fixed charge layer to this structure, generation of dark current caused in the positive electric charges held in the light receiving unit can be controlled regardless of presence of the incident light.

If the CMOS sensor is configured to photoelectrically converts the incident light to positive electric charges, it is preferable that the amounts of carbon and nitrogen in the first through third charge holding films are higher than the values shown in FIG. 6A and FIG. 6B.

Moreover, in case of the CMOS sensor that photoelectrically converts the incident light to positive electric charges, in order to suitably terminalize the interfaces of each charge holding film, the contents of hydrogen in the first through third charge holding films are required to be or around the values shown in FIG. 6A and FIG. 6B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device, comprising:
   a light receiving unit for converting an incident light to an electric current;
   a first charge holding film holding electric charges, formed above the light receiving unit; and
   a second charge holding film holding electric charges, formed on the first charge holding film,
   wherein concentration of oxygen in the second charge holding film is higher than concentration of oxygen in the first charge holding film.

2. The solid-state imaging device according to claim 1, wherein the first charge holding film and the second charge holding film hold negative electric charges, and
   the light receiving unit generates negative electric charges by receiving the incident light.

3. The solid-state imaging device according to claim 1, wherein the first charge holding film and the second charge holding film hold positive electric charges, and the light receiving unit generates positive electric charges by receiving the incident light.

4. The solid-state imaging device according to claim 1, wherein
the first charge holding film and the second charge holding film comprise metal oxide, containing the same metallic elements.

5. The solid-state imaging device according to claim 1, wherein
the first charge holding film has a different crystal structure from the second charge holding film.

6. The solid-state imaging device according to claim 5, wherein
the first charge holding film has a different crystal structure from the second charge holding film.

7. The solid-state imaging device according to claim 1, further comprising:
a third charge holding film holding electric charge, formed on the second charge holding film.

8. The solid-state imaging device according to claim 7, wherein
the first charge holding film and the second charge holding film comprise metal oxide, and the third charge holding film comprises silicon oxide.

9. The solid-state imaging device according to claim 8, wherein
the thickness of the second charge holding film is at least ten times thinner than the thickness of the first charge holding film.

10. The solid-state imaging device according to claim 7, wherein
the thickness of the second charge holding film is at least ten times thinner than the thickness of the first charge holding film.

11. A solid-state imaging device, comprising:
a light receiving unit for converting an incident light to an electric current; and
a charge holding laminate for holding electric charges, formed above the light receiving unit, wherein
the charge holding laminate comprises a first charge holding film and a second charge holding film that is formed above and in contact with the first charge holding film, and
concentration of oxygen in a first charge holding film is higher than concentration of oxygen in a second charge holding film.

12. The solid-state imaging device according to claim 11, wherein
the first charge holding film and the second charge holding film hold negative electric charges, and
the light receiving unit generates negative electric charges by receiving the incident light.

13. The solid-state imaging device according to claim 11, wherein the first charge holding film and the second charge holding film hold positive electric charges, and
the light receiving unit generates positive electric charges by receiving the incident light.

14. The solid-state imaging device according to claim 11, wherein
the first charge holding film and the second charge holding film comprise metal oxide, containing the same metallic elements.

15. The solid-state imaging device according to claim 11, wherein
the first charge holding film has a different crystal structure from the second charge holding film.

16. The solid-state imaging device according to claim 15, wherein
the first charge holding film has a different crystal structure from the second charge holding film.

17. The solid-state imaging device according to claim 11, wherein
the charge holding laminate further comprises a third charge holding film that is formed above and in contact with the second charge holding film.

18. The solid-state imaging device according to claim 17, wherein
the first charge holding film and the second charge holding film comprise metal oxide, and the third charge holding film comprises silicon oxide.

19. The solid-state imaging device according to claim 17, wherein
the thickness of the second charge holding film is at least ten times thinner than the thickness of the first charge holding film.

20. A manufacturing method of a solid-state imaging device comprising:
forming a light receiving unit for converting an incident light to a electric current;
forming a first charge holding film holding electric charges above the light receiving unit; and
forming a second charge holding film holding electric charge on the first charge holding film,
wherein concentration of oxygen in the second charge holding film is higher than concentration of oxygen in the first charge holding film.

* * * * *